(12) United States Patent  
Jacobson et al.

(10) Patent No.: US 8,937,001 B2  
(45) Date of Patent: Jan. 20, 2015

(54) PATTERNING OF NANOSTRUCTURES

(75) Inventors: Joseph M. Jacobson, Newton, MA (US); David Kong, Lexington, MA (US); Vikas Anant, Cambridge, MA (US); Ashley Salomon, Chicago, IL (US); Saul Griffith, Cambridge, MA (US); Will DelHagen, Cambridge, MA (US); Vikrant Agnihotri, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/347,662

(22) Filed: Jan. 10, 2012

(65) Prior Publication Data

US 2012/0108041 A1 May 3, 2012

Related U.S. Application Data

(62) Division of application No. 10/444,176, filed on May 23, 2003, now Pat. No. 8,093,144.

(60) Provisional application No. 60/383,396, filed on May 24, 2002.

(51) Int. Cl.
*H01L 21/20* (2006.01)
*B82Y 10/00* (2011.01)
*C23C 14/02* (2006.01)
*C23C 14/04* (2006.01)
*C23C 14/22* (2006.01)
*C23C 16/04* (2006.01)
*C23C 16/455* (2006.01)

(52) U.S. Cl.
CPC ............... *B82Y 10/00* (2013.01); *C23C 14/024* (2013.01); *C23C 14/048* (2013.01); *C23C 14/228* (2013.01); *C23C 16/047* (2013.01); *C23C 16/45525* (2013.01); *C23C 16/45555* (2013.01)
USPC ...................... 438/478; 438/509; 257/E21.16

(58) Field of Classification Search
USPC ............ 438/497, 500; 257/E21.109, E21.16, 257/E21.471, E21.497
See application file for complete search history.

(56) References Cited

U.S. PATENT DOCUMENTS

2002/0098653 A1* 7/2002 Flagan et al. ................. 438/260

* cited by examiner

*Primary Examiner* — Cheung Lee
(74) *Attorney, Agent, or Firm* — Norma E. Henderson

(57) ABSTRACT

A technique for forming nanostructures including a definition of a charge pattern on a substrate and introduction of charged molecular scale sized building blocks (MSSBBs) to a region proximate the charge pattern so that the MSSBBs adhere to the charge pattern to form the feature.

14 Claims, 15 Drawing Sheets

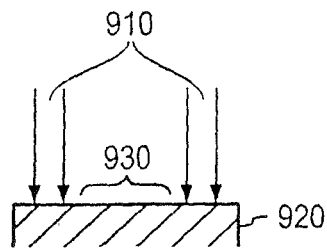
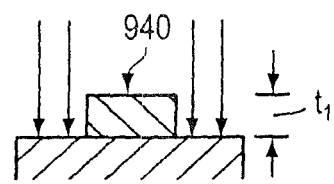
FIG. 9A　　　　　　　　FIG. 9B
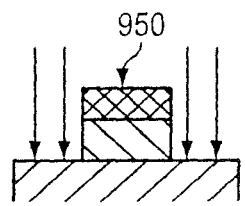
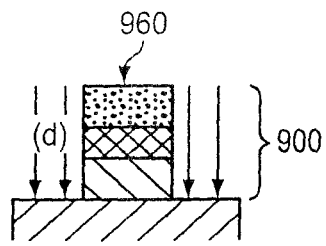
FIG. 9C　　　　　　　　FIG. 9D
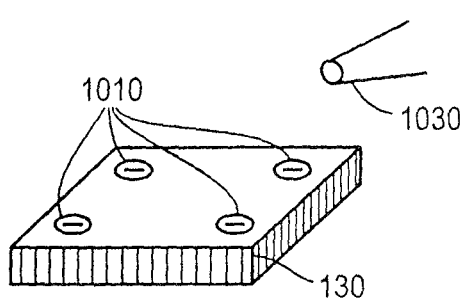
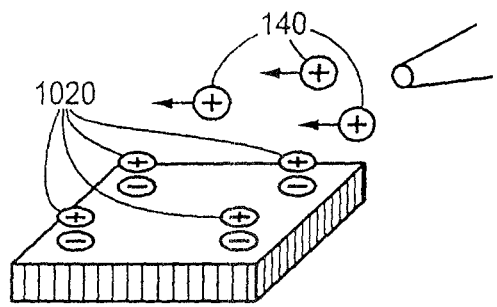
FIG. 10A　　　　　　　FIG. 10B
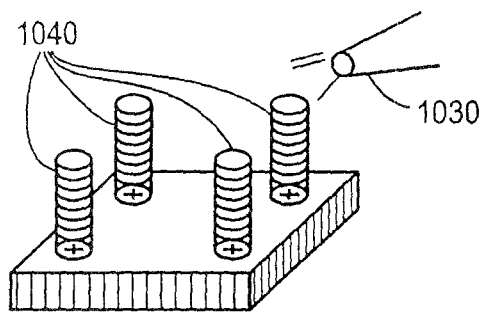
FIG. 10C

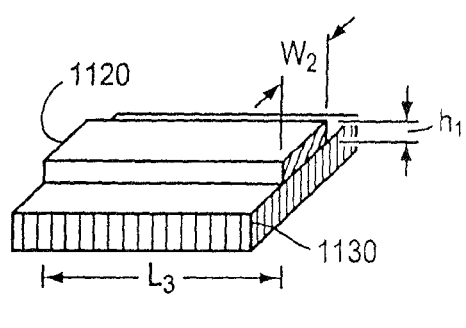
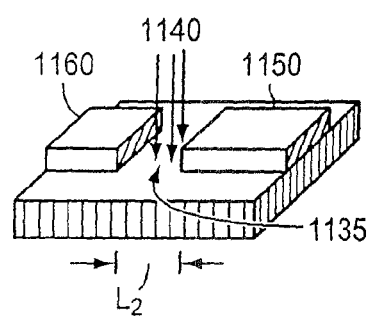
FIG. 11A    FIG. 11B
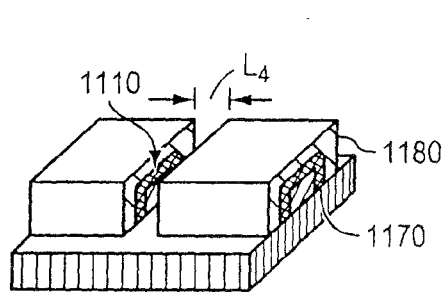
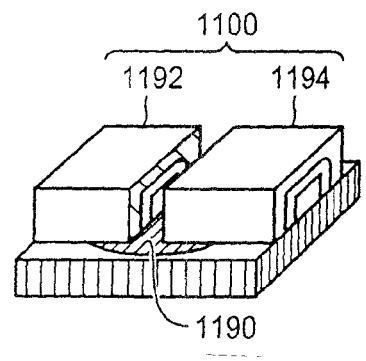
FIG. 11C    FIG. 11D

PATTERNING OF NANOSTRUCTURES

RELATED APPLICATIONS

This application is a divisional application of U.S. patent application Ser. No. 10/444,176, filed May 23, 2003, now U.S. Pat. No. 8,093,144, issued Jan. 10, 2012, the entire disclosure of which is herein incorporated by reference, which claims the benefit of U.S. Provisional Application Ser. No. 60/383,396, filed May 24, 2002, the entire disclosure of which is herein incorporated by reference.

FIELD OF THE TECHNOLOGY

The present invention relates to the fabrication of two- and three-dimensional functional structures with a characteristic length scale below 100 nanometers (nm).

BACKGROUND

Presently there is great interest in the fabrication of functional semiconductor devices with length scales below 100 nm, i.e., nanoelectronics. The laws of physics allow, in theory, the building of logic devices such as transistors with characteristic length scales on the order of about 1 nm. Reaching these limits, however, is difficult and expensive.

Methods for fabricating devices below 100 nm include both top down and bottom up approaches. Conventional top down approaches such as photolithography or electron beam lithography utilize formation and selective removal of various levels to form functional devices. Top down processes are very expensive for devices with features below 100 nm. In addition, such methods can generally be used only to build two-dimensional logic, typically on a planar silicon wafer, and historically have followed Moore's law yielding only a factor of two increase in device density every 18 months.

Direct-write top down approaches have included atomic force microscopy (AFM) direct writing of liquids, i.e., dip pen nanolithography and scanning tunneling microscopy (STM) writing of oxides and charge replicas. These methods suffer from slow speeds, lack of a general set of building materials for fabricating electronic components, and a constraint to two-dimensional structures.

Tools for creating three-dimensional structures employ, for example, electron beam and ion beam decomposition of chemical vapor precursors. Such tools have been useful in mask and chip repair and have been shown to be capable of writing three-dimensional structures. Typically, organometallic precursor gases adsorbed onto substrate surfaces are decomposed using energy supplied from incident beams, depositing the desired metal or insulator. This technique facilitates deposition of nanometer- to micrometer-size structures with nanometer precision in three dimensions and without supplementary process steps such as lift-off or etching procedures. Although successful in creating high resolution three-dimensional structures, both scanning electron microscopy (SEM) and focused ion beam (FIB) chemical vapor deposition (CVD) suffer from significant contamination by the organic components of precursor gases. Carbon contamination from typical precursor gases may exceed 50%, thus altering device conductivities to levels unacceptable for many desired applications. Device fabrication by energetic-beam CVD is also constrained by an inherently small number of available precursor gases, thus limiting the variety of materials that can be deposited. Finally, because existing processes are serial and sufficient beam energy must be applied to decompose the precursor, deposition speeds are very slow.

In bottom up approaches, layers are selectively applied to (rather than removed from) a substrate. For example, nanoscaled building blocks synthesized precisely by chemistry or other methods may later be assembled by, e.g., self assembly. Presently the complexity of logic which may be built in this way is extremely limited.

Nature is excellent at predicated assembly of complex molecules such as DNA on a scale similar to that of present-day nanostructures. Nature can make precise molecules with enzymes such as polymerase that typically have extremely low error rates by utilizing feedback and performing error correction. However, direct feedback and error correction are seldom implemented in present fabrication processes, and hence the yield of functional devices is low in comparison to functional molecules formed by biological processes.

SUMMARY

The present invention facilitates a precise and rapid patterning of very high purity nanoscale building blocks in two and three dimensions in order to build functional ultrahigh density devices.

In an aspect, the invention features a method for forming a feature, the method including forming a charge pattern on a substrate, the charge pattern having a first type of charge. The method also includes introducing a plurality of at least one of molecular size-scale and nanoscale building blocks to a region proximate the charge pattern, the building blocks having a second type of charge and adhering to the charge pattern to form the feature.

One or more of the following features may be included. The building blocks may be at least one of ions, nanoclusters, nanoparticles, and organic molecules. The charge pattern may be formed with an energy beam, such as an ion beam, an electron beam, or a photon beam. The adhered nanoclusters may be globally sintered. The nanoclusters may be less than 100 nm in overall dimension. The nanoclusters may be introduced by dusting. The nanoclusters may be directed toward the substrate as a stream, such that the nanoclusters adhere only to the charge pattern. A velocity of the plurality of nanoclusters may be controlled. The velocity of at least a portion of the plurality of nanoclusters may be reduced in the region proximate the charge pattern. The velocity of at least a portion of the plurality of nanoclusters may be controlled by an electric field that may be alternating. The velocity of at least a portion of the plurality of nanoclusters is controlled by a magnetic field that may be alternating. The velocity of at least a portion of the plurality of nanoclusters is controlled by a charged aperture disposed near the substrate.

The first type of charge may be positive or negative. The second type of charge may be positive, negative, or neutral.

The charge pattern may include a dot and at least one nanocluster may adhere to the dot to form an initiation site for a nanowire. A precursor may be introduced to a region proximate the initiation site to initiate growth of the nanowire.

In another aspect, the invention features a method for forming a structure, the method including defining a charge pattern by an energy beam; and correcting an error in the charge pattern.

One or more of the following features may be included. Correcting the error in the charge pattern may include providing a feedback loop comparing a set of charge data to data corresponding to a desired charge pattern. The charge pattern may have a first type of charge, the error may include a misplaced charge, and correcting the error may include discharging the error with a second beam having a second type of charge, such as an ion or an electron beam. A plurality of nanoclusters may be introduced to a region proximate the charge pattern, the nanoclusters having the second type of charge and adhering to the charge pattern to define the structure, and the error may be corrected after the charge pattern is formed and before the plurality of nanoclusters is introduced. The error may include a missing charge in the charge pattern and correcting the error may include adding a charge to the charge pattern with the energy beam.

In another aspect, the invention features a method for forming a structure, including introducing a plurality of at least one of molecular-size scale and nanoscale building blocks onto a surface of a substrate to form the structure; and correcting an error in the structure.

One or more of the following features may be included. Correcting the error in the structure may include providing a feedback loop comparing a set of charge data to data corresponding to a desired structure. Correcting the error may include performing an additive correction. Correcting the error may include depositing a charge on the substrate and introducing at least one additional building block to a region proximate the charge. Correcting the error comprises performing a subtractive correction, which may include removing a portion of the structure with, e.g., a beam.

In another aspect, the invention features a method for forming a feature, including introducing a plurality of at least one of molecular-size scale and nanoscale building blocks to a region proximate a substrate; and simultaneously scanning a pattern on the substrate with an energy beam. The energy beam causes a change in at least one physical property of at least a portion of the building blocks such that a probability of the portion of the building blocks adhering to the pattern scanned by the energy beam is increased.

One or more of the following features may be included. The energy beam may include at least one of an electron beam and an ion beam. The change in the physical property may be caused by direct collision between the energy beam and the portion of the building blocks. The change in the physical property may be caused by sintering. The energy beam may sinter the portion of the nanoclusters by heating at least a portion of the substrate proximate the portion of the nanoclusters.

In another aspect, the invention features a method for forming a feature, the method including introducing a plurality of at least one of molecular-size scale and nanoscale building blocks to a region proximate a substrate, and simultaneously scanning a pattern on the substrate with an energy beam. The energy beam and at least a portion of the nanoclusters interact by electrostatic interaction to form the feature on the substrate.

In another aspect, the invention features a method for creating a charge retention layer. The method includes providing a substrate, adsorbing a thin layer of a gas onto a surface of the substrate to create the charge retention layer; and defining a charge pattern on the thin adsorbed layer.

One or more of the following features may be included. The thin layer may have a thickness of one monolayer. The adsorbed gas may be an inert gas, such as xenon. The inert gas may be adsorbed at a low temperature. The adsorbed gas may include a hydrocarbon vapor. Adsorbing the hydrocarbon vapor may include cracking and depositing the hydrocarbon vapor.

In another aspect, the invention features a method for forming a structure, the method including providing a substrate, defining a first region of the substrate having a charge of a first type, defining a second region of the substrate having a charge of a second type; and dusting the first and second substrate regions with a plurality of at least one of molecular-size scale and nanoscale building blocks having a charge of the second type. The building blocks are repelled from the first substrate region and attracted to the second substrate region.

One or more of the following features may be included. A charge pattern may be formed on the substrate, the charge pattern having the second type of charge and a second plurality of at least one of molecular-size scale and nanoscale building blocks may be introduced to a region proximate the charge pattern, the nanoclusters having the first type of charge, the nanoclusters adhering to the charge pattern.

In another aspect, the invention features a method for forming a feature, the method including creating a virtual mask on a substrate and depositing a monolayer on a region of the substrate substantially free of the virtual mask to form the feature.

One or more of the following features may be included. Creating the virtual mask may include scanning an energy beam, such as an ion beam, in a pattern on the substrate. Depositing the monolayer may include atomic layer deposition.

A nanostructure may be defined on the substrate, and a gap may be defined in the nanostructure with the gap initially having a first length. The monolayer may be deposited over the nanostructure and the gap, and after the deposition of the monolayer, the gap may have a second length, the second length being less than the first length.

In another aspect, the invention features a system including a deposition chamber. Disposed within the deposition chamber, a beam source is arranged to form a charge pattern on a substrate placed within the deposition chamber. A molecular size-scale building block (MSSBB) source is disposed outside the deposition chamber, the MSSBB source arranged to introduce a plurality of at least one of MSSBBs and nanoscale building blocks to a region proximate the charge pattern. The deposition chamber, beam source, and MSSBB source are capable of being maintained at a vacuum.

One or more of the following features may be included. A feedback monitoring system may be in electrical communication with the beam source and the MSSBB source, for correcting errors caused by at least one of the beam source and the MSSBB source.

In another aspect, the invention features a system including a deposition chamber. Disposed within the deposition chamber is a beam source arranged to form a charge pattern on a substrate placed within the deposition chamber. An MSSBB source is disposed outside the deposition chamber, the MSSBB source arranged to introduce a plurality of at least one of MSSBBs and nanoscale building blocks to a mass selector. A mass selector is disposed in fluid communication with the MSSBB source. The mass selector is capable of introducing a plurality of at least one of MSSBBs and nanoscale building blocks having a pre-determined mass and charge to a region proximate the charge pattern. The deposition chamber, beam source, MSSBB source, and mass selector are capable of being maintained at a vacuum.

The following feature may be included. A feedback monitoring system may be in electrical communication with the beam source, the MSSBB source, and the mass selector, for correcting errors caused by at least one of the beam source, the MSSBB source, and the mass selector.

BRIEF DESCRIPTION OF THE DRAWINGS

The foregoing discussion will be understood more readily from the following detailed description of the invention, when taken in conjunction with the accompanying drawings, in which:

FIGS. 9(a)-(d) are schematic diagrams of a structure formed by atomic layer deposition;

FIGS. 10(a)-(c) are schematic diagrams of a process for creating nanowires;

FIGS. 11(a)-(d) are schematic diagrams of an atomic layer deposition process for creating very thin gaps;

Figure 1A:
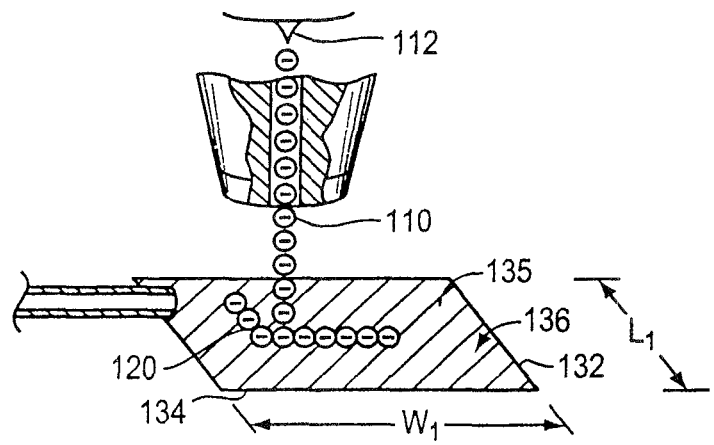
FIGS. 1(a)-(c) are schematic diagrams of an electron beam-based nanopatterning process for writing a charge pattern.

Like referenced features identify common features in corresponding drawings.

DETAILED DESCRIPTION

In one approach for patterning nanoscale building blocks, arbitrary three-dimensional nanostructures of high purity are formed by rapidly creating a charge pattern of nanoscale dimensions on a substrate using a scanning beam, generating very high purity molecular size-scale building block (MSSBB) of a first type that image the charge pattern, and sintering the MSSBBs to form a locally solid layer delineated by the charge pattern by an additional global heating source. In some embodiments, nanoscale building blocks (NSBB) may be used to image the charge pattern. MSSBBs or NSBBs may be any one of organic molecules, such as nucleotides, amino acids, or self-assembling monolayers, ions, nanoclusters, and nanoparticles. In a preferred embodiment, MSSBBs are nanoclusters, which may have dimensions ranging from 0.2 nm to more than 100 nm. More specifically, when the nanoclusters are introduced in proximity to the charge pattern, the nanoclusters are attracted to the pattern, thereby "imaging" the charge pattern. A charged nanocluster is attracted to its opposite charge on a surface of the substrate. Neutral particles may also be attracted by induced dipoles. The process is repeated with nanoclusters of a second type to create arbitrary three-dimensional nanostructures. In addition to inorganic nanoclusters, organic molecules which have an affinity for a charge pattern or which themselves can be charged and thus have an affinity for a charge pattern may also be similarly patterned. The charge pattern may be created and represented digitally, or it may be used to control the action of the scanning beam. In some embodiments, aerosols may be used to develop charged surfaces for xerography [see, e.g., J. T. Bickmore, in *Xerography and Related Processes*, edited by J. H. Dessauer and H. E. Clark (Focal Press, New York, 1965) Chap. 11, p. 309, incorporated herein by reference].

An alternative approach to creating arbitrary three-dimensional nanostructures of high purity involves globally dusting a surface with nanoparticles, sintering selected regions with a scanning energy beam, removing unsintered nanoparticles by, e.g., a supercritical carbon dioxide ($CO_2$) etch, and repeating the procedure.

Both approaches may be used to create electronic structures ab initio or to place additional components on a pre-existing semiconductor chip made by conventional (e.g., photolithographic) methods.

This process is highly versatile in comparison to existing technologies because of, inter alia, the wide variety of materials that may be magnetron sputtered to form the nanoclusters, such as metals, inorganic semiconductors, and insulators. The range of sputtered materials is higher than the number of existing precursor gases. Also, in contrast to some top-down approaches, these nanoclusters do not require an organic capping group, and fabricated devices, therefore, are nearly 100% pure.

In alternative embodiments, other patterning methods are possible which may give higher resolution. For example, instead of patterning solely negative charges, negative charges as well as positive charges in areas may be patterned in distinct areas using a dual-beam, scanning electron, and/or focused ion beam source.

Figure 1B:
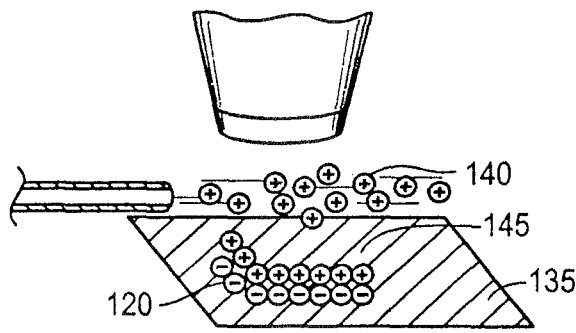
Figure 1C:
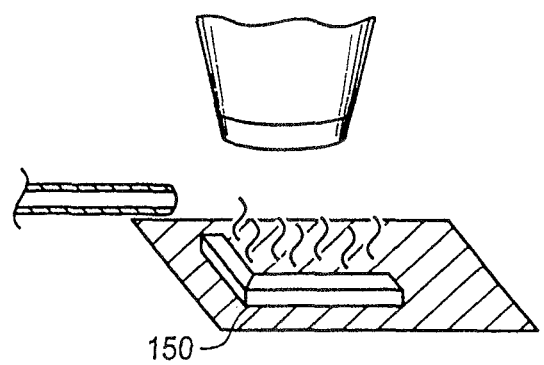

Referring to FIGS. 1(a)-(c), nanoscale structures are fabricated by nanoelectrography. An energy beam, such as an electron beam 110 may be used for the fabrication of features having nanoscale dimensions. In some embodiments, the energy beam may be an ion beam or a photon beam. Electron beam 110 may have a first type of charge, i.e., a negative charge, and may be generated by an electron beam source 112, e.g., an environmental scanning electron microscope (ESEM) such as the XL-30 Esem-FEG manufactured by FEI Company, Hillsboro, Ore. Electron beam 110 may be deflected by electrostatic steering plates (not shown). Electron beam 110 writes a charge pattern 120, also referred to as a charge replica, onto a substrate 130. In the embodiment shown in FIG. 1(a), the pattern is negatively charged. Substrate 130 may be formed of, for example, an electret, i.e., a dielectric material capable of storing charge, such as mylar, poly(methylmethacrylate), $SiO_2$, or $CaTiO_3$. Substrate 130 may be square with sides 132, 134 having a length $l_1$ of, e.g., 1 centimeter (cm) and a width $w_1$ of, e.g., 1 cm, respectively. Substrate 130 may be obtained from, for example, Goodfellow Corporation, based in Pennsylvania. In some embodiments, an ion beam [see, e.g., Fudouzi et al., Adv. Mater 14 1649 (2002), incorporated herein by reference, who use a 30 keV $Ga^+$ ion beam to write positively charged patterns in $CaTiO_3$]e, an atomic force microscope (AFM) writing head

[see, e.g., P. Mesquida and A. Stemmer, *Adv. Mater.* 13 1397 (2001), incorporated herein by reference, who induce negative or positive charge patterns in poly(tetra-fluoroethylene) (PTFE) by applying voltage pulses of ±15-20V to the tip], microcontact stamping of charge [see, e.g., H. O. Jacobs and G. M. Whitesides, Science 291 1763 (2001), incorporated herein by reference, who have been working toward submicron trapping of charge in thin layers of PMMA on n-doped silicon by applying 10-20 V between the conductive silicon support and a patterned gold-coated poly (dimethylsiloxane) stamp], may be used to generate charge pattern 120.

Referring to FIG. 1(*b*), a plurality of nanoclusters 140, here shown to be positively charged, are introduced to a region 145 proximate charge pattern 120. Passing by the charge pattern 120, nanoclusters 140 are attracted to the substrate 130 and adhere to negatively charged substrate surface 135, forming a patterned feature 150. In some embodiments, a plurality of MSSBBs may be introduced to region 145, and may adhere to substrate surface 135 to form feature 150.

Nanoclusters 140 may be generated by an MSSBB or NSBB source such as the NC200-UHV Gas Condensation Nanocluster Source manufactured by Oxford Applied Research (not shown). This apparatus includes a DC-magnetron based sputtering source that forms nanoclusters 140 by condensing atoms of sputtered material within a cooled aggregation region and then sweeping them from the device on a laminar flow of argon and/or helium. Nanoclusters may be neutral, negative, or positively charged. Nanoclusters may be filtered to introduce nanoclusters of a specific mass or charge by a mass and charge selection apparatus such as a QMF20 Mass Quadrupole filter available from Oxford Applied Research (not shown). Nanoclusters are positively charged in the embodiment shown in FIG. 1(*b*).

In some embodiments, a matrix-assisted laser desorption ionization (MALDI) mass spectrometry source is used as an MSSBB or NSBB source. An example of a suitable MALDI mass spectrometery source is, e.g., the Profiler MALDI-TOF mass spectrometery system manufactured by Stanford Research Systems, Sunnyvale, Calif. The MALDI mass spectrometry source creates charged fragments from larger molecules. The larger molecules are typically organic molecules, such as nucleotides, amino acids, or self-assembling monolayers. This mass spectrometery source can filter out a specific charged species of appropriate mass and direct it towards the charged surface. This approach may be used to, for example, build a gene chip of very high density. Examples of other suitable sources include, for example, cesium-doped negative sputter ion beam sources such as one manufactured by Plasmion (formerly Skion) Technology Corporation, or an ionized beam K-cell, such as the IBE1 or IBE10 Ionised Beam K-cell manufactured by Oxford Applied Research. An MSSBB or NSBB source may also be an ion source for small atomic-layer epitaxy (ALE) precursors such as $ZnCl_2$ and $H_2S$. Ions of these ALE precursors may be prepared in an ion source and then directed to charged pattern 120 to create monolayers of the ALE precursor to enable subsequent spatially patterned ALE.

The sputtered material from which nanoclusters 140 are formed may be a metal such as copper (Cu) or aluminum (Al); an inorganic semiconductor such as silicon (Si), germanium (Ge), indium phosphide (InP), gallium arsenide (GaAs); and an insulator such as silicon dioxide ($SiO_2$). Such nanoclusters may emerge from the MSSBB or NSBB source having a second type of charge, i.e., positive, negative, or neutral, and may be separated by electrostatic separation plates. In an embodiment, nanoclusters 140 are positively charged. Nanoclusters 140 may have a diameter selected from a range of 0.2 nm to greater than 100 nm. Preferably, nanoclusters 140 are less than 100 nm in overall dimension.

Referring to FIG. 1(*c*), nanoclusters 140 are sintered into a bulk material, e.g., a monolayer, by, for example, a peltier heating stage. Peltier heating stages are thermoelectric modules that provide heat globally upon application of a low voltage DC power. Sintering of, e.g., 2 nm diameter silver (Ag) nanoclusters, is performed at approximately 300° C. An alternative global sintering device, such as a laser, may also be employed. The steps of forming charge pattern 120, introducing nanoclusters 140, and sintering nanoclusters 140 may be repeated to form several adjacent monolayers.

Figure 2A:
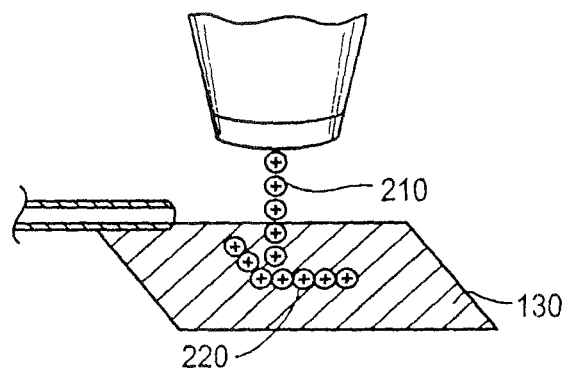
FIGS. 2(a)-(c) are schematic diagrams of an ion beam-based nanopatterning process for writing a charge pattern.
Figure 2B:
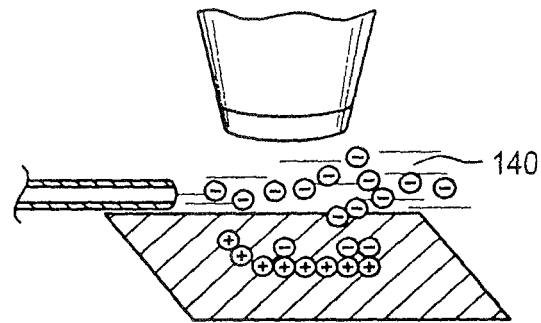
Figure 2C:
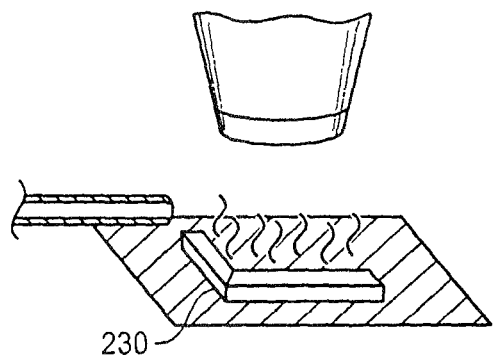

Referring to FIGS. 2(*a*)-(*c*), an alternative approach to nanoelectrography may be used for fabricating nanoscale structures. A focused ion beam of positive ions 210 delivered from, for example, a Strata™ DB235 source manufactured by FEI Company, writes a positive charge pattern 220 onto substrate 130. In an embodiment, nanoclusters 140 are negatively charged. A plurality of negatively charged nanoclusters 140, filtered via a selection apparatus from the nanocluster source (not shown), pass over the charge pattern 220, are attracted to the positively charged charge pattern 220 on substrate 130, and adhere to substrate 130. The velocity of the nanoclusters 140 may be manipulated via electric and magnetic fields, e.g., in accordance with the methods described below with reference to FIGS. 4(*a*)-4(*c*). Referring to FIG. 2(*c*), nanoclusters 140 are sintered into a bulk material by global heating provided from a source such as a peltier heating stage (not shown) or laser (not shown) to form a feature 230.

Figure 3:
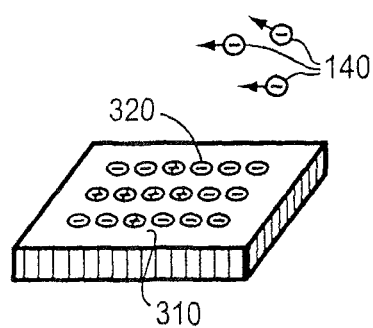
FIG. 3 is schematic diagram illustrating deposition of nanoclusters with charge masking.

Referring to FIG. 3, several embodiments of charge patterning are possible, including negative or positive charge masking in which nanoclusters of one charge are repelled from regions of like charge, and nanoclusters of neutral charge or opposite charge are attracted to the mask. For example, a first charge pattern 310 having a charge of a first type, e.g., positive, may be formed on a first region of a substrate by, e.g., a positive ion beam (not shown). First charge pattern 310 may be surrounded by a second region of the substrate, e.g., second charge pattern 320 having a charge of a second type, e.g., negative. The substrate may be dusted with a plurality of at least one of MSSBB and nanoscale building blocks, such as nanoclusters 140, having a charge of the second type, e.g., negative. Negatively charged nanoclusters 140, filtered by a selection apparatus (not shown), are strongly attracted to positive charge pattern 310 and are less likely to deposit on substrate regions defined by the negative charge pattern 320. A similar effect may be achieved by reversing polarities such that first charge pattern 310 has a negative charge, second charge pattern 320 has a positive charge, and nanoclusters 140 has a positive charge, so that positively charged nanoclusters 140 are strongly attracted to positive charge pattern 310 and are less likely to deposit on regions defined by the negative charge pattern 320.

Referring to FIGS. 4(*a*)-4(*c*), the kinetic energy of nanoclusters 140 may also be manipulated by subjecting charged nanoclusters 140 to electric and magnetic fields. Appropriately placed, such fields may decrease or increase the velocity of nanoclusters 140 having a desired charge, thereby increasing the likelihood of the species adhering to a charge pattern 420. For example, to increase the probability of charged nanoclusters 140 being attracted and adhering to negatively charged charge pattern 420, the velocity of positively charged nanoclusters 415 may be decreased. The probability of attraction and adherence of these nanoclusters 140, therefore, may be manipulated by controlling the kinetic energy of the nanoclusters via electric or magnetic fields.

Figure 4A:
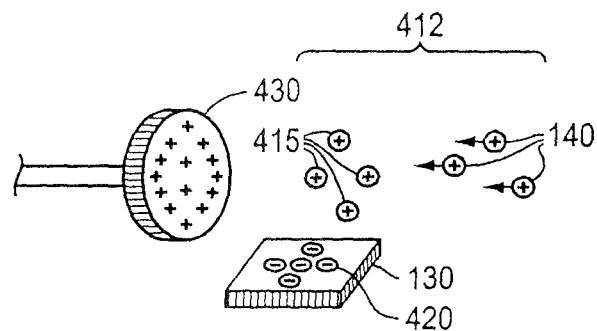
FIGS. 4(a)-(c) are schematic diagrams of various configurations of electric and magnetic fields for manipulating the velocities of charged nanoclusters.

More particularly, referring to FIG. 4(a), nanoclusters 140 having a specific charge may be selected by introducing an opposing field incident to a nanocluster beam 412. In an embodiment, positively charged nanoclusters 140 may be used to develop a negative charge pattern 420 in substrate 130 to form a patterned feature (not shown). Nanoclusters 140 have an initial velocity and travel incident to a conducting plate 430. Conducting plate 430 may include a conducting material such as, for example, copper. Conducting plate 430 may held at a positive potential to slow down incident positive nanoclusters. At an appropriate potential, a velocity of a portion 415 of nanoclusters 140 approaches zero, thus increasing the influence of the electric field of charge pattern 420 on the portion 415 of nanoclusters 140. This potential may be determined by utilizing an ion gauge to measure the number of deposited positive nanoclusters 140, and the zero velocity condition would be met when the ion gauge counts zero particles. The polarities of conducting plate 430, charge pattern 420, and nanoclusters 140 may be reversed to achieve a similar effect, e.g., conducting plate 430 and nanoclusters 140 may have a negative potential, and charge pattern 420 may be positively charged.

Figure 4B:
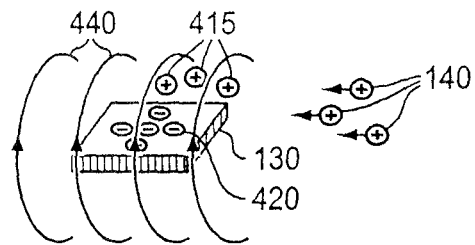

Referring to FIG. 4(b), electric and magnetic fields used for manipulating the energies of nanoclusters 140 may also alternate, for example, in the radio frequency regime. Initially high energy, charged nanoclusters 140 may be trapped in an alternating field 440 generated by, for example, an alternating current (AC) power supply, leading to a high-density of zero-velocity particles 415 within alternating field 440. In an embodiment, a vacuum chamber (not shown) housing a high-energy patterning beam of, e.g., electrons or ions, may also have an appropriate electrode configuration for generating alternating field 440 for trapping nanoclusters 140. After charge pattern 420 is written, the cluster beam may be initiated and nanoclusters 140 with a desired charge, i.e., a charge different from the charge of the charge pattern, may be subsequently trapped directly above charge pattern 420. The portion 415 of charged nanoclusters 140 having a velocity of zero would then be attracted to a localized electric field generated by charge pattern 420.

Figure 4C:
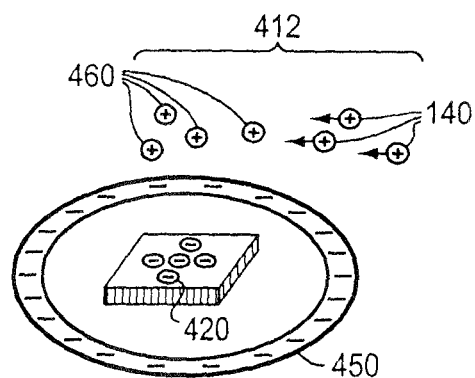

Referring to FIG. 4(c), other measures may also increase the likelihood of charged nanocluster 140 deposition. For example, a conducting wire aperture 450 may be held at a negative potential. Substrate 130, having a negative charge pattern 420 is mounted in a center portion of aperture 450. Positively charged nanoclusters 140 from a cluster beam 412 are attracted to conducting wire aperture 450. Positively charged nanoclusters 140 will be influenced at longer distances, e.g., 10 cm by the negative potential of wire aperture 450, but as they approach wire aperture 450, charged nanoclusters 460 are attracted to the smaller local field of the negatively charged charge pattern 420. A similar effect may be achieved by patterning a large aperture feature (not shown) directly into substrate 130, and patterning finer features in the center of the aperture. Such effects may also be seen by reversing the polarities of the aperture 450, charge pattern 420, and nanoclusters 140. Charged aperture 450 may be used in conjunction with any of the methods described above with reference to FIGS. 1 to 8, 10, 13, 15, and 16 for reducing the velocity of the desired charged nanoclusters 140.

The fidelity of patterned features, such as patterned feature 150 [see FIG. 1(c)], may be improved by alternating between charging and dusting processes. An exact amounts of charge may be placed onto an electret substrate 130 by knowing the charge retention capability of the substrate and by controlling the current of the beam used to create the charge pattern. A cluster counting scheme similar to "channeltron" ion counting may be incorporated, whereby nanoclusters introduced into a chamber in which the substrate is disposed may be counted, with an accuracy on the order of a single nanocluster. A channeltron single ion detector may be used to count the number of nanoclusters generated. Such a detector could be, for example, the Channeltron Mass Spec Detector made by Burle Technologies Inc. This method is widely used for ion detection, but may also be used for nanocluster detection. Charged nanoclusters are focused to the channeltron detector. A nanocluster striking the detector generates secondary electrons that have an avalanche effect to create more electrons. Eventually, sufficient secondary electrons are generated to induce a pulse. The transmitted current from the detector is directly proportional to the number of nanoclusters hitting the detector. With this count, one may calculate the deposition rate of the nanoclusters, thereby calculating the time necessary to dust the substrate with an approximate number of nanoclusters with charge equal and opposite to the charge on the substrate . A high-speed shutter or set of electrostatic plates (not shown) may be used to shut off the cluster beam when the desired number of nanoclusters have been shot. The nanoclusters deposit on patterned charged regions. This process also neutralizes any charge present on the substrate and prepares it for the next alternation between charging and dusting. This alternation may be done at high frequencies to rapidly generate features of interest.

Figure 5A:
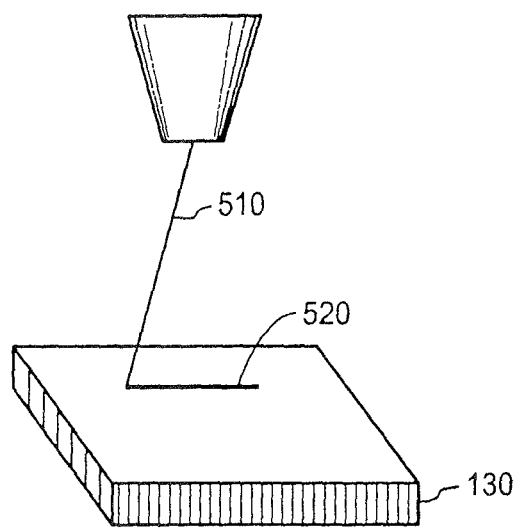
FIGS. 5(a)-(b) are schematic diagrams of fabrication by rapidly alternating between the charging and dusting processes.
Figure 5B:
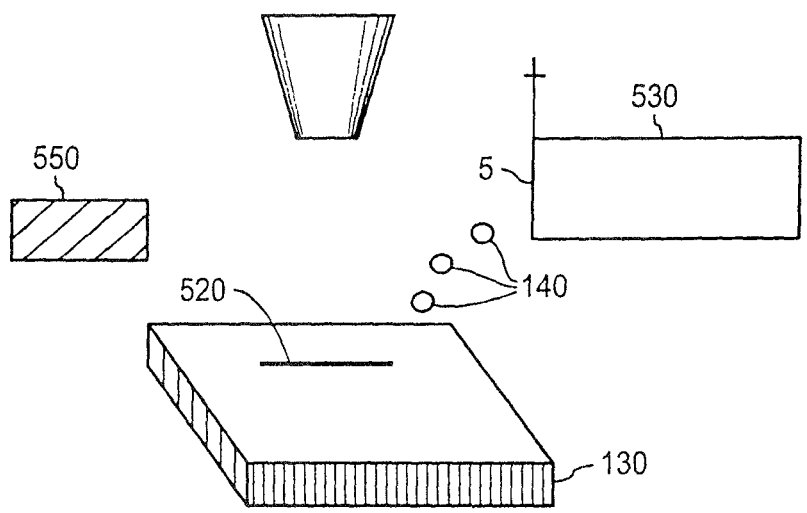

Referring to FIGS. 5(a)-5(b), nanostructure fabrication may be carried out by alternating between charging and dusting processes as follows. A scanning beam 510 may put down a line of charge 520 on substrate 130. In an embodiment, scanning beam 510 may define a point of charge, the charge being of a first type, e.g., negative. Referring to FIG. 5(b), substrate 130 with charge line 520 may be dusted with nanoclusters 140 having a polarity of a second type opposite to that of charge line 520, e.g., positive. An MSSBB or NSBB source such as a Nanocluster Source from Oxford Applied Research 530 may be used to eject nanoclusters 140.

A cluster source gate 540, disposed between cluster source 530 and a deposition chamber (not shown) in which substrate 130 is disposed, remains closed during charge writing. Then, after a charge pattern, such as charge line 520 is defined, gate 540 is opened and clusters 140 are deposited onto substrate 130 to form a pattern defined by charge line 520. In some embodiments, in addition to gate 540, another mass or charge selector may be employed to eject nanoclusters 140. For example, a mass quadrupole such as Oxford Applied Research's QMF200 Quadrupole Mass Filter (not shown) may be used to provide nanoclusters 140 having a specified mass and charge. A Channeltron 550 may be used to gauge a deposition time required to release a specific number of nanoclusters 140. After charge line 520 is written, the cluster source 530 may be operated for the calculated deposition time to deposit a desired number of nanoclusters 140.

In some embodiments, a substrate on which a charge pattern is written may be formed from a conductive material, such as gold, and, therefore, charge pattern may dissipate after it is defined. Here, one or several monolayers of adsorbate, such as an inert gas that is physically adsorbed at low temperature or a self-assembling monolayer, may be deposited onto the substrate in order to retain the charge pattern. Upon sintering, the inert adsorbate may enter the gas phase and not become part of the final structure formed on the conductive substrate. A very thin layer, e.g., one or several monolayers, of an inert gas such as xenon may be also be employed. Such a gas may be adsorbed onto the substrate surface at a low temperature to form a charge retention layer. The charge pattern may then be written and imaged thereon.

Alternatively, hydrocarbons, such as methane or an aromatic hydrocarbon vapor may be used to assist with charge retention by forming charge retention layers on conductive substrates. Hydrocarbon vapors, such as those generated by colloidal graphite, may be introduced into a deposition chamber. A scanning beam may crack the vapors and deposit them selectively onto beam raster regions. Either during or subsequent to deposition, the scanning beam may be used to charge the deposited hydrocarbon vapors. Conductive substrates may then be dusted with oppositely charged nanoclusters that deposit on the charged hydrocarbon vapors. During sintering of the nanoclusters, the hydrocarbon vapors get desorbed from the substrate surface, thereby preventing contamination of the substrate with hydrocarbons.

Figure 6A:
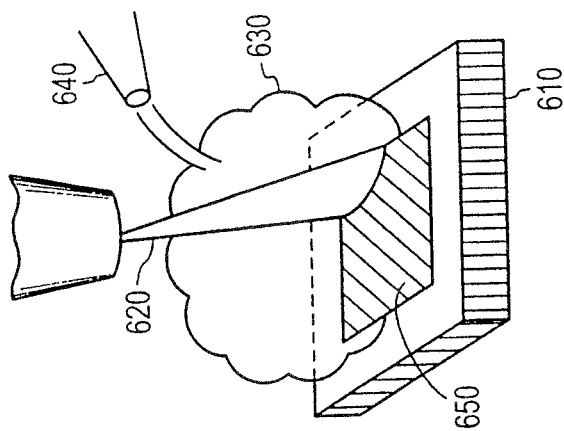
FIGS. 6(a)-(c) are schematic diagrams of deposition on conductive substrates using charged hydrocarbon vapors.
Figure 6B:
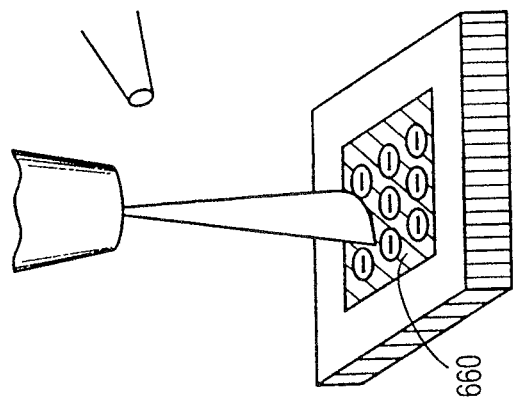
Figure 6C:
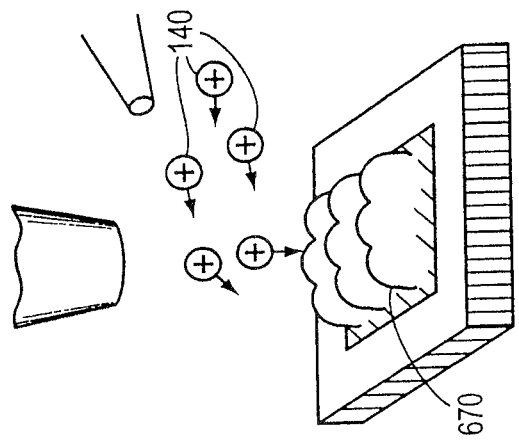
Figure 7:
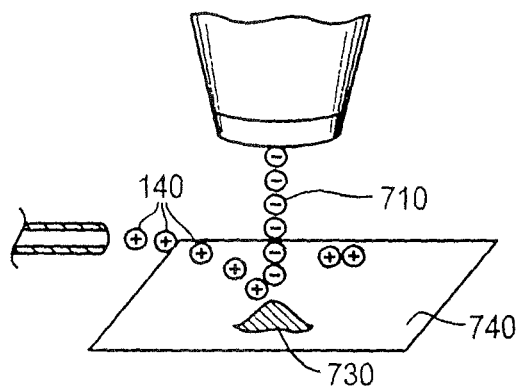
FIG. 7 is a schematic diagram of an electron beam based nanopatterning process with direct beam energy sintering of nanoclusters.

More specifically, referring to FIG. 6(a)-(c), the hydrocarbon deposition and charging approach may be used to fabricate features 600 on a conductive substrate 610. Conductive substrate 610 may be made from, for example, gold. Referring to FIG. 6(a), a scanning beam 620 cracks hydrocarbon vapors 630. Hydrocarbon vapors 630 can be introduced by a gas injection needle 640, which could be, for example, a modified Gas Injection System sold by FEI Corp. A hydrocarbon vapor pattern 650 defined by the scanning beam 620 is then formed. Referring to FIG. 6(b), scanning beam 620 charges the hydrocarbon vapors 660. Hydrocarbon vapors may be charged either during deposition or as a separate step after deposition. As illustrated in FIG. 6(b), charged vapors 660 may be negatively charged. Referring to FIG. 6(c), substrate 610 is dusted with nanoclusters 140 having a polarity opposite to that of hydrocarbon vapor pattern 660. Nanoclusters 140 are attracted to hydrocarbon vapor pattern 640, and deposit thereon to form features 670.

Physical properties of molecular-size scale and nanoscale building blocks, such as nanoclusters 140, may be altered by energy beams. For example, referring to FIG. 7, an energy beam, such as an electron beam 710 delivered from a source such as an SEM, scans a pattern and directly interacts with nanoclusters 140, delivered from a nanocluster source, e.g., an Oxford Applied Research NC200-UHV source. This interaction may be caused by direct collision between the energy beam and a portion of the building blocks, i.e., between electrons from electron beam 710 and nanoclusters 140. In an embodiment, both the cluster beam composed of nanoclusters 140 and the electron beam 710 fire simultaneously. Electron beam 710 thereby may change at least one physical property of at least a portion of the nanoclusters 140 such that the probability of the adherence of the portion of the nanoclusters 140 to the pattern scanned by the electron beam 710 is increased. In some embodiments the electron beam 710 may sinter at least a portion of nanoclusters proximate a substrate 740, forming feature 730 on substrate 740. Feature 730 may be defined by the pattern scanned by electron beam 710. Substrate 740 may be formed from, for example, a dielectric material like $SiO_2$. Sintering requires imparting energy from electron beam 710 to nanoclusters 140. For example, 2 nm diameter Ag clusters sinter when sufficient energy is delivered to raise clusters to temperatures of approximately 300° C. Such energy can be imparted by direct collision between nanoclusters and electrons, or by locally heating at least a portion of the substrate 730 proximate nanoclusters 140 using the electron beam 710. Nanoclusters 140 in the region proximate to energy beam 710 and the substrate 730 may then directly sinter on the substrate forming feature 730.

Figure 8:
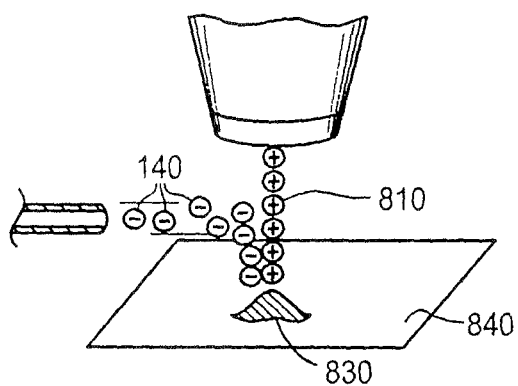
FIG. 8 is a schematic diagram of an ion beam based nanopatterning process with direct beam energy sintering of nanoclusters.

Referring to FIG. 8, an ion beam 810 scans a pattern and directly interacts with nanoclusters 140, resulting in the alteration at least one physical property of at least a portion of building blocks, such as nanoclusters 140, such that the probability of the adherence of the portion of the nanoclusters 140 to the pattern scanned by the ion beam 810 is increased. In an embodiment, the cluster beam composed of nanoclusters 140 and the ion beam 810 fire simultaneously. The interaction between ion beam 810 and nanoclusters 140 may result in a change of at least one physical property of at least a portion of nanoclusters 140 as a result of a process such as, e.g., sintering. Material sintered by ion beam 810 may build a feature 830 on substrate 840, e.g., a Si wafer. Sintering of nanoclusters 140 may occur by direct collision with ions, or by sintering due to a high local temperature of at least a portion of substrate 840 in a region defined by ion beam 810. Feature 830 is defined by the pattern scanned by ion beam 810, to which at least a portion of the building blocks, such as nanoclusters 140, adhere.

In an embodiment, the energy beam, such as electron beam 710 or ion beam 810, may interact with at least a portion of a plurality of nanoclusters 140 by electrostatic interaction to form the features 730, 830.

An alternative method for defining a nanostructure by the use of an energy beam and a nanoscale deposition method involves the process of atomic layer deposition (ALD), or equivalently, atomic layer epitaxy (ALE). ALD enables sequentially controlled saturating surface reactions. This process is advantageous over other forms of deposition because it allows the creation of boundaries that are atomically precise. In a simple ALD apparatus, an atomic monolayer may be created across an entire substrate. This may not be desirable. Alternatively, the aforementioned set-up for the construction of nanostructures using a FIB [see FIGS. 2(a)-(c)] may be used to create a mask on the substrate, which is populated with a monolayer in situ by ALD. The monolayer may include, e.g., elements such as Zn, Cd, Hg, Mn, S, Se, Te, and As, or metal oxides such as aluminum oxide ($Al_2O_3$), tin oxide ($SnO_2$), or indium-tin oxide (ITO) that exhibit high conductivity. An additional advantage of using ALD to form a monolayer is that discontinuities may be intentionally created in the monolayer at well-defined points by focussing an electron beam or a FIB during the ALD process. The electron beam or FIB may locally heat an area or pattern on the substrate so that the thermal energy generated by the beam re-evaporates any molecules or elements that would otherwise bond with the underlying layer. If the beam is scanned in a pattern on the substrate during the ALD process, molecules or elements may be re-evaporated at points along the pattern, creating a virtual negative mask. This process may be used to grow atomically precise surfaces with cavities and discontinuities. These discontinuities may be used, for example, in the area of photonics, where light can be guided in crystalline substrates along sharp angles by using intentionally discontinuous media.

Referring to FIG. 9(a)-(d), a structure 900 is fabricated by combining FIB and ALD. A virtual mask 910 is created by scanning the FIB in a pattern on substrate 920, with enough energy in the beam to re-evaporate molecules and break chemisorption bonds. Substrate 920 may be a semiconductor substrate such as, for example, a p-type doped silicon substrate. The ALD process is initiated, and monolayers are deposited on substrate 920 in region 930 where the FIB is not scanned. Monolayers are sequentially deposited to form a first layer 940 in region 930 until a desired thickness $t_1$ is achieved, e.g., 100 Å. This procedure is repeated to deposit monolayers to form second and third layers 950, 960 of different composition, to define a nanowire 970. First, second, and third layers 940, 950, and 960 may be, for example, alternating organic and inorganic layers. This method combining FIB and ALD enables formation of layers with atomic precision, and allows the fabrication of striped nanowires with atomically precise junctions, i.e., nanowires with layers of alternating composition.

Referring to FIGS. 10(a)-(c), nanowires may be created by an alternative method involving writing of charge patterns and deposition of nanoclusters. In an embodiment, the methods described above with reference to FIGS. 1(a)-5, 7, and 8 may be used to create growth initiation sites either for nanowires (see, e.g., Hu, et al., *Acc. Chem. Res.* 1999, 32, 435-445, incorporated herein by reference) or nanotubes (see, e.g., Dai et al., *J. Phys. Chem. B,* 1999, 103, 11246-11255, incorporated herein by reference). Hu and co-workers used a nanocluster catalyst to localize a reactant in a chemical vapor deposition process at a specific temperature that promoted vapor phase supersaturation of the cluster, resulting in one-dimensional growth of a single crystal nanowire. Dai and co-workers used nanocluster catalysts, such as a Fe/Mo bimetallic cluster in a methane CVD process, to nucleate the growth of single wall nanotubes. In an aspect of the present invention, a CVD precursor gas is introduced into the chamber and is nucleated at initiation sites deposited in accordance with the invention to create nanowires or nanotubes. More specifically, a charged beam of electrons or ions may write a pattern of four charged dots 1010 in substrate 130, as shown in FIG. 10(a). The substrate 130 and charged dots 1010 are then dusted with positive nanoclusters 140, resulting in the deposition of four individual nanoclusters 1020, as shown in FIG. 10(b). These nanoclusters 1020 serve as nucleation sites for nanowire growth, and may include a conductive material, e.g., gold. An gas injection needle 1030, for example, the Gas Injection System (GIS) manufactured by SEI, Corp. may be used to inject a precursor thus initiating growth of nanowires 1040 at the nucleation sites defined by nanoclusters 1020, as shown in FIG. 10(c). The precursor may be one of many gases, such as silane ($SiH_4$), and nanowires many be formed from various materials, e.g., silicon. An advantage of this approach is that it enables precise control of the size of a nanocluster, and the precise positioning of a nanocluster on a substrate, which dictate the quality of the nanotube/nanowire, and the complexity of a three-dimensional functional structure, respectively.

The ALD and FIB may be combined with a third technique, ESEM, to create a very thin gap between two structures. Referring to FIGS. 11(a)-(d), a particle trap 1100 may be created by fabricating a gap 1110 with nanometer precision in a nanostructure 1120. Gap 1110 may be used to trap particles in a fashion similar to that used by Bezryadin et al., who fabricated platinum electrodes with a spacing of ~4 nm and were able to trap a single conducting nanoparticle composed of Pd (see, e.g., Bezryadin, A., C. Dekker, and G. Schmid, *Applied Physics Letters,* 1997. 71(9): p. 1273-1275, hereby incorporated by reference). In contrast to Bezryadin et al., who defined spacing with standard techniques such as electron-beam lithography and reactive ion etching, gap 1110 is defined by a combination of ALD, FIB, and ESEM. A nanostructure 1120 may be formed on a substrate 1130 using the processes described above with reference to FIGS. 1 to 5, 7 to 9, or another process. Nanostructure 1120 may be formed of a metal like platinum (Pt), Cu, or Al; an inorganic semiconductor such as Si, Ge, InP, GaAs; or an insulator such as silicon dioxide ($SiO_2$). Substrate 1130 may be formed from an insulator, such as $SiO_2$. Subsequently, an ion beam 1140 may mill a gap 1135 in structure 1110, with a gap of length $l_2$ being smaller than either a length $l_3$, width $w_2$, or height $h_1$ of nanostructure 1120. The length $l_2$ of gap formed by ion milling depends on the material used in nanostructure 1120 and on ion beam milling parameters and is, e.g., on the order of tens of nanometers. Sections 1150 and 1160 of nanostructure 1120 are then coated with second and third monolayers 1170, 1180 using the FIB/ALD process as described in reference to FIG. 9, to close gap 1130 to a length $l_4$ that is, e.g., on the order of nanometers. Second and third monolayers 1170 1180 may be formed of, e.g., elements such as Zn, Cd, Hg, Mn, S, Se, Te, and As, or metal oxides such as aluminum oxide ($Al_2O_3$), tin oxide ($SnO_2$), or indium-tin oxide (ITO) that exhibit high conductivity. Finally, a region 1190 of substrate 1130 may be etched with a suitable etchant such as, for example, hydrofluoric acid (HF) to form a first and a second free-standing structure 1192,1194 to define the particle trap 1100. Particle trap 1100 may be capable of creating strong electric fields with very high gradients by the application of a voltage between first and second free-standing structures 1192, 1194. Particles in the proximity of gap 1110 will become polarized and may be trapped in gap 1110 or its proximity.

Similar structures with alternating layers of monolayers of nanoclusters and organic molecules may be fabricated without requiring an initial molecular layer, e.g., gold, to serve as a template. The method for forming such structures is substantially the same as the process described with reference to FIG. 1 or 2, except that, instead of nanoclusters, organic molecules, e.g., thiols, are dusted and are attracted to the charge layer patterned by the charged beams, e.g., ion or electron beams. Next, inorganic nanoclusters, e.g., gold, adhere to the organic molecules, e.g., thiols. These steps are repeated to build structures of alternating organic and inorganic layers.

Figure 12:
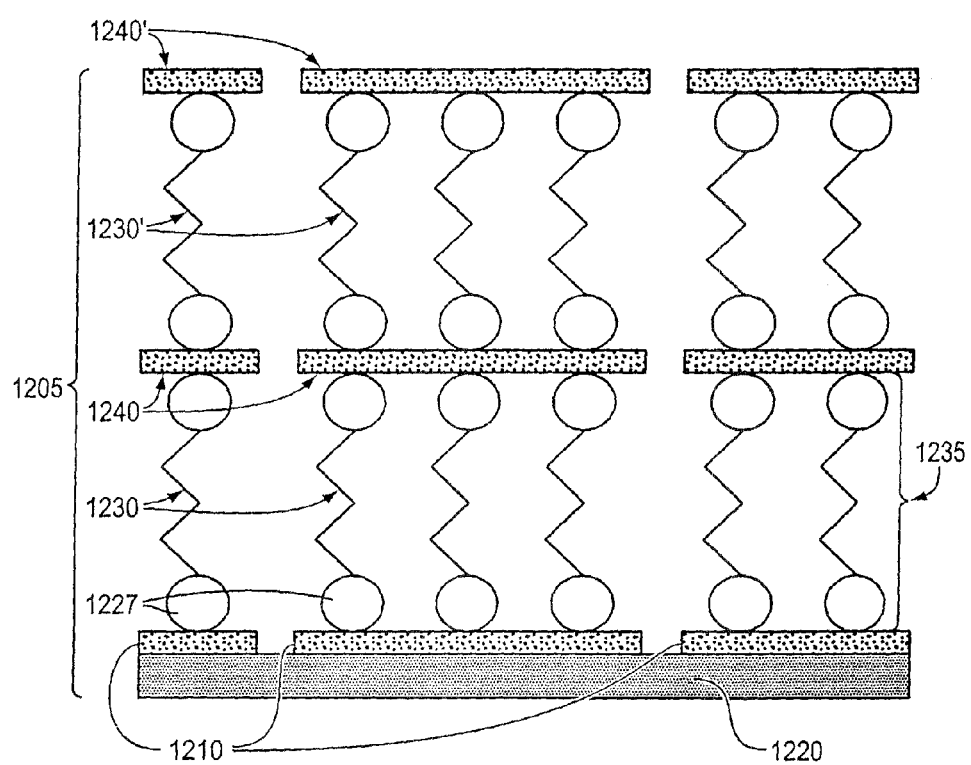
FIG. 12 is a schematic diagram of a fabrication process utilizing alternating organic molecule and inorganic nanocluster layers.

More particularly, referring to FIG. 12, a structure 1205 with alternating organic and nanocluster layers may be formed as follows. An initial patterned layer 1210, e.g., gold, is defined by, e.g., a process described in reference to FIGS. 1 to 9, 13 or other lithographic processes, on a substrate 1220 formed from, e.g., silicon. Organic molecules 1230, e.g., linear molecules terminated with thiols at both ends, readily form selective bonds with specific inorganic nanoclusters, e.g., gold. These organic molecules 1230 self-assemble onto the initial patterned layer 1210, creating a monolayer 1235 of organic molecules that retains the image pattern of the initial patterned layer 1210. The organic monolayer 1235 now has one terminated end group 1237, e.g., a thiol, bonded to the initial pattern layer 1210 and another end group that is exposed. Next, nanoclusters 1240 that selectively bond to the exposed end of the organic molecule, e.g., gold, are dusted over substrate 1220 and adhere to the exposed end groups of the monolayer 1235 composed of organic molecules 1230. After global sintering, the process of self assembly of organic molecules 1230 and nanocluster dusting is repeated to produce patterned structures of alternating monolayers of nanoclusters 1240, 1240' and organic molecules 1230, 1230'.

The fabrication methods described with reference to FIGS. 1 to 12 operate by serial processing. Although the charge patterning process may be rapid, the process in which energy is transferred to the nanoclusters may be relatively slow. In certain embodiments, to increase write speeds, it may be desirable to have a parallel beam process.

In an embodiment, multiple beams may operate in parallel to deliver energy or deposit charge on a substrate, e.g., 10,000 beams arranged in a 100×100 array. This multiplicity of beams may increase fabrication speed by many orders of magnitude. The beams may be independently controlled. For example, in an array of laser beams, each laser may be scanned across the surface of a substrate by one micro-mirror in a micro-mirror array. Alternatively, the array of beams may be controlled all together, as in the case of an array of parallel electron beams controlled by one set of electromagnetic optics, with pattern control provided by on-off control of individual beams within the array, allowing digital control of the resulting pattern.

In one implementation, a parallel array of electron beams may be generated by an array of light beams directed by a micro-mirror array incident onto a photocathode. Such a device may have, for example, a 100×100 beam array. The photocathode may be held at a high potential relative to the substrate, and an electron beam is generated at each point where light is incident on the photocathode. This beam array may be focused and scanned by a single set of electromagnetic optics that controls all the beams in parallel. Control of the micro-mirror array allows each individual beam to be quickly turned on and off, providing a means for digital control of the exposure pattern defined by the beams on a substrate. This array of beams may be scanned across the surface of a substrate, allowing high-speed, high-resolution charge patterning.

Figure 13A:
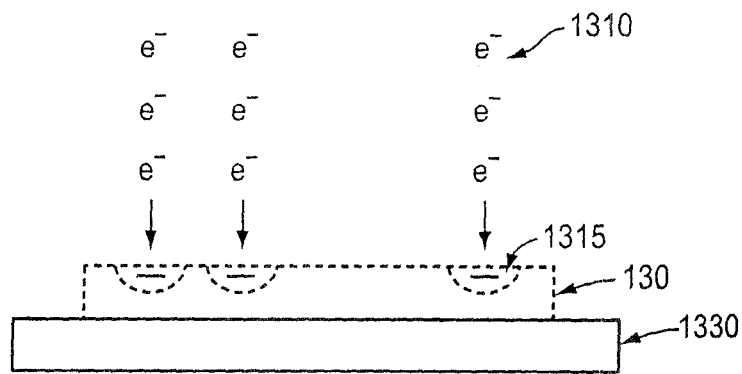
FIGS. 13(a)-(c) are schematic diagrams of electron beam based charge nanopatterning processes with multiple beams running in parallel.
Figure 13B:
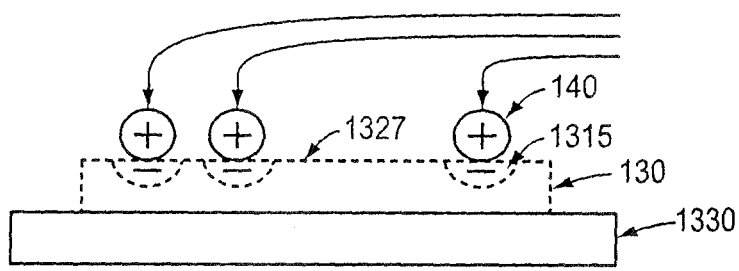
Figure 13C:
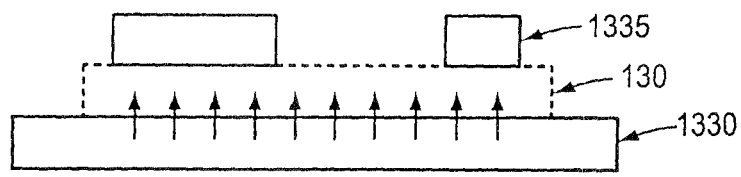

More particularly, referring to FIG. 13(a)-(c), multiple electron beams 1310 are simultaneously incident in parallel on an electret substrate 130, thereby developing a charge pattern 1315. This charge pattern 1315 is thus created in a single step rather than by the scanning of a single beam across the entire substrate 130 multiple times. A plurality of positively charged nanoclusters 140 deposit onto a surface 1327 of substrate 130 and arrange themselves on the charge pattern 1315. A global heating source 1330 heats substrate 130, thereby sintering the nanoclusters 140 to form a continuous structure 1335 that includes the nanocluster 140 material. Global heating source may be, for example, a hot plate or a laser. This process may be scaled up to many thousands of beams or more, and therefore the fabrication speed may be increased by many orders of magnitude.

Figure 14:
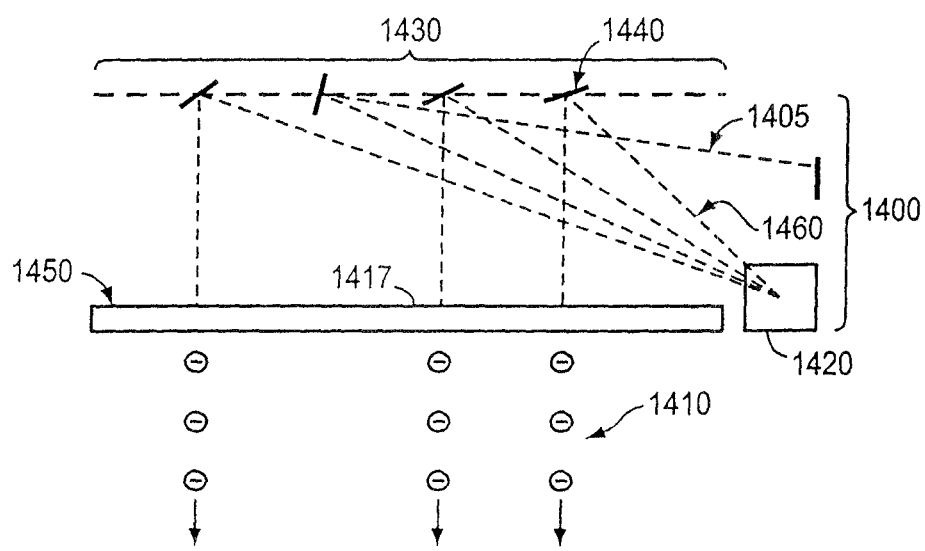
FIG. 14 is a schematic diagram of a method for generating an array of parallel electron beams by a micro-mirror array and a photocathode.

Referring to FIG. 14, a system 1400 enables the generation of a controllable array of electron beams 1410 by the use of a light source 1420, an array 1430 of micro-mirrors 1440, and a photocathode 1450. Micro-mirror array 1430 may be, for example, a Digital Micromirror Device (DMD) array such as Texas Instruments' 0.55 SVGA DDR system. Micro-mirror array 1430 may be used to modulate the illuminating light source 1420, e.g., a laser. Photocathode 1450 may be fabricated by depositing a thin film of gold having a thickness of, e.g., 15 nm onto a transparent substrate and illuminating the gold through the transparent substrate. The transparent substrate may be formed of, e.g., quartz and sapphire and may have a thickness of, e.g., 1 mm [See, e.g., X. Jiang, C. N. Berglund, A. Bell, and W. Mackie, "Photoemission from Gold Thin Films for Application in Multi-photocathode Arrays for Electron Beam Lithography," *J. Vac. Sci. Technol.*, B16, pp. 3374-3376, November/December 1998, incorporated herein by reference]. Light source 1420 directs a beam of light 1460 at each micro-mirror 1440 in array 1430. The mirrors 1440 tilt to direct the light beams 1460 onto a surface 1417 of the photocathode 1450 directly below mirrors 1430, or to direct beams 1405 away from the photocathode 1450 entirely. When the light beams 1460 strike the photocathode 1450, the light beams 1460 generate electron beams 1410 that are then used in the fabrication methods described with reference to, e.g., FIGS. 1, 4 to 7, 10, 12 and 15 to 17. System 1400 allows precise digital control of a large array of electron beams 1410.

The nanostructure formation methods described above with reference to FIGS. 1 to 14 may also utilize direct feedback to ensure accuracy in the fabrication of functional structures. Feedback may be introduced at different stages of processing. It may either be done directly after the formation of the charge pattern or after nanocluster deposition. For example, after a charge is written, a voltage contrast image of the substrate may be obtained. Errors in charge placement due to a first beam may be removed by discharging the errors with a second beam of opposite charge polarity. The first beam may be an electron beam and the second beam may be a positive ion beam. In an embodiment, the energy beam may be a laser. In another embodiment, input for feedback may be an image that communicates topography of the built structure, for example, an image taken with an SEM, which is compared to the desired structure via computer vision algorithms. Alternatively, input for feedback may be from a collection of composition-specific data, for example, an energy dispersive x-ray (EDX) detector, where the detector returns the identity of the element or elements from which the structure is formed. An elemental map of the formed structure may also be combined with a topographical map and compared to the desired structure. In another embodiment, input for feedback may be an excitation of the nanoclusters that induce optical emission, such as electroluminescence (EL) (see e.g., Lee, T.-H. and R. M. Dickson "Single-Molecule LEDs from Nanoscale Electroluminescent Junctions." *Journal of Physical Chemistry:* ACS ASAP incorporated herein by reference) which may be then collected via sensitive charged couple devices (CCD).

After comparing data collected from various sources, which may be, for example, a map collected via an EDX detector, an SEM image, an FIB image, and/or a CCD image that may be used to pinpoint the position and composition of nanoclusters via EL, to the desired data corresponding to an ideally built structure, a computer algorithm may compute the steps required for correction of the structure, if there are any discrepancies, and the necessary corrections may be performed. The corrections may be additive (when part of the structure needs to be created), subtractive (when part of the structure needs to be removed) or both (when dealing with complex corrections of three-dimensional structures). One embodiment of the subtractive corrections may employ ion beam etching, for example, with an FIB. Any of the methods mentioned previously with reference to FIGS. 1 to 8, 10, 12 and 13 may be used to perform additive corrections.

The feedback process enables high-yield through error-detection and error-correction. A voltage contrast image of the substrate may be taken after charge patterning the substrate. Errors in charge absence may be corrected by recharging regions that should have been charged according to the original pattern. In another form, a positive ion beam may be used to charge the substrate and an electron beam may be used for the subsequent error correction.

Figure 15:
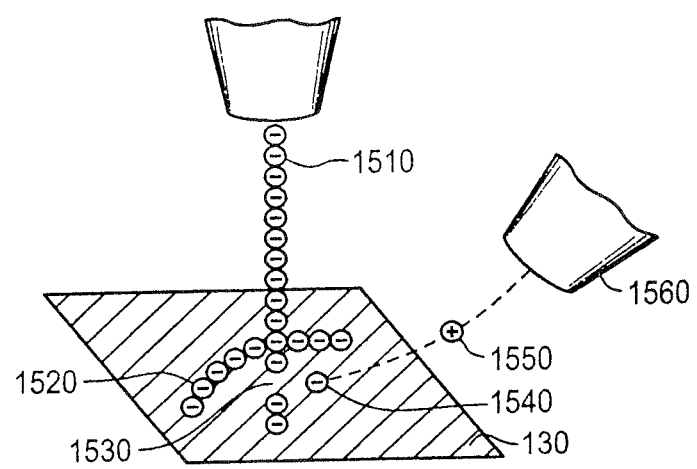
FIG. 15 is a schematic diagram of error correction performed by a combination of positive ion and negative electron or ion beams.

Referring to FIG. 15, an error in a charge pattern may be corrected as follows. An electron beam 1510 writes a charge pattern 1520 on substrate 130, with an error 1530 of missing charge. Electron beam 1510 can be used to correct error 1530 by adding a negative charge to the spot 1530 where a charge is missing. An error of misplaced charge 1540 may be corrected by neutralizing the misplaced charge 1540 with a positive charge 1550. A positive ion beam 1560 may be used to generate the positive charge 1550.

Figure 16:
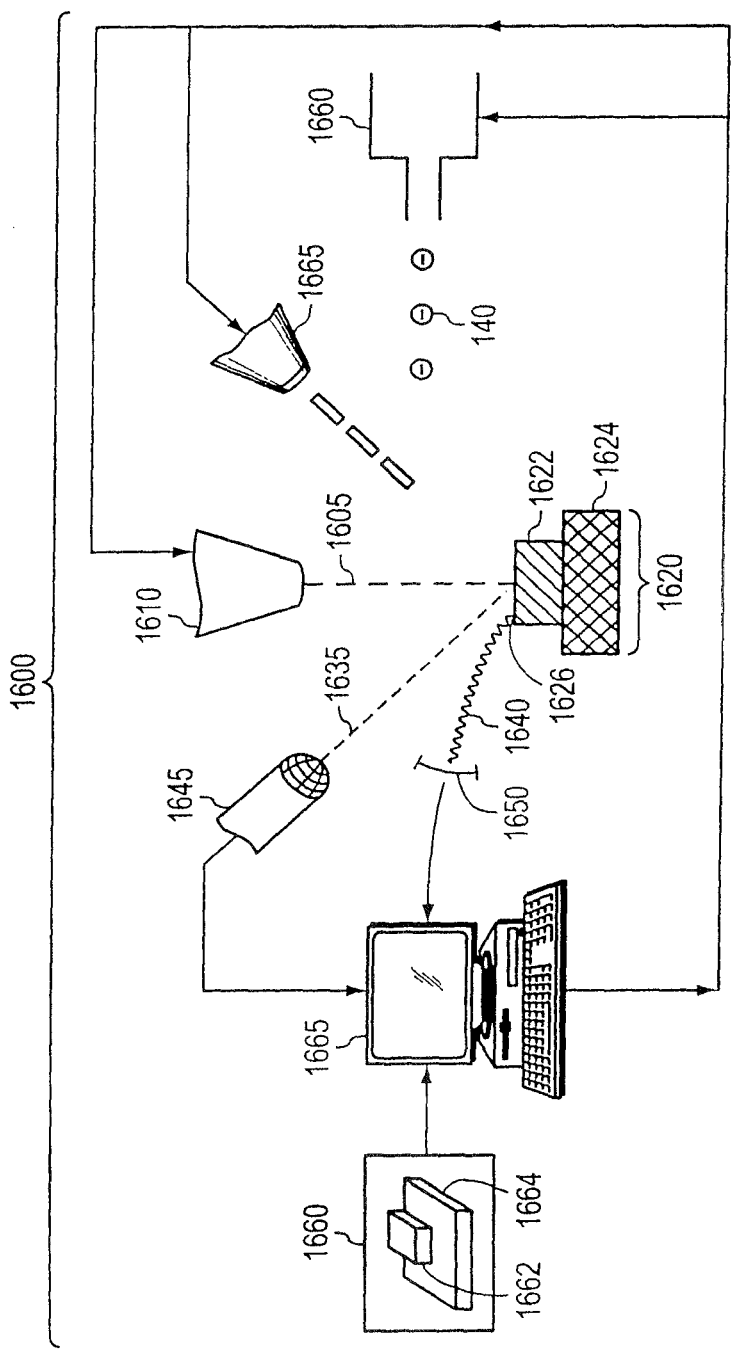
FIG. 16 is a schematic diagram illustrating a feedback process.

Referring to FIG. 16, a feedback system 1600 enables the correction of errors immediately after the definition of a charge pattern or after the dusting the substrate with nanoclusters. An electron beam 1605 is emitted from an SEM 1610, and is incident on a nanostructure 1620. Nanostructure 1620 may be a nanoelectronic device or a portion thereof, that includes first and second features 1622, 1624. First and second features 1622, 1624 may vary in composition and in dimension. Nanostructure 1620 may be formed, for example, using the fabrication methods described above, e.g., with reference to FIGS. 1 to 15. When electron beam 1605 collides with a surface 1626 of feature 1622, secondary electrons 1635 and x-rays 1640 are emitted. The number of emitted secondary electrons 1635 depends on the topography and, to a lesser extent, on the composition of the feature 1622. For example, an edge is generally relatively easily discernable as the secondary electron count is generally high for edges of structures. The wavelength of x-rays emitted depends solely on the composition of feature 1622, making it possible to create an elemental map of the nanostructure 1620 including first and second elements 1622, 1624. The data corresponding to topography may be collected by a secondary electron detector (SED) 1645, and elemental data may be collected by an energy dispersive x-ray (EDX) detector 1650, e.g., an EDAX Phoenix EDS X-ray microanalysis system. Feedback input parameters are not limited to detectors 1645, 1650. Other embodiments of collected data, for example, may include a CCD image corresponding to electroluminescence of the particles that compose the nanostructure 1620 under an applied electromagnetic field.

The data collected from detectors 1645, 1650 may be correlated and analyzed by computation system 1655 that includes one or more computers with associated software and hardware. Computation system 1655 compares the data collected to data relating to a desired nanostructure 1660 with desired first and second features 1662, 1664 corresponding to the fabricated features 1622, 1624. If computation system 1655 determines that a processing error has occurred, it may provide feedback in a number of ways. If an additive correction has to be performed, computation system 1655 may, for example, send a signal to cluster source 1660 to generate nanoclusters 140, and also send signals to SEM 1610 and FIB 1665 to deposit the required charge needed to repair the nanostructure 1620 by addition of nanoclusters. If a subtractive correction has to be performed, computation system 1655 may, for example, send a signal to FIB 1665 to remove material from the nanostructure 1620. Thus the feedback loop is closed between the actual nanostructure 1620 and desired nanostructure 1660, and the process may be repeated until the desired functional structure is formed.

In an embodiment, cluster by cluster feedback fabrication enables highly precise processing. Cluster by cluster feedback fabrication utilizes a beam with an electrostatic apparatus capable of placing single charges, a cluster source with mass quadrupole or other electrostatic filter that can select a single cluster, and a feedback system that detects the placement of that cluster at the region of the deposited charge. The feedback system may utilize the processing elements discussed with reference to FIGS. 15 and 16, and instruct the single-cluster delivery system to eject another cluster of appropriate mass and charge to the charge pattern if the initial cluster placement is inaccurate. The write and dust procedure may employ alternating between charging and dusting, as discussed with reference to FIGS. 5(a)-5(b).

To implement the above-described feedback scheme in parallel with an array of charged beams, each beam may have its own associated detector or detectors 1645, 1650.

To analyze the composition of nanostructures such as, for example, nanostructure 1620, a combination of analysis of x-rays 1640 with EDX and milling with FIB 1665 may be used. EDX may be used for elemental analysis of regions of micron dimensions. Although EDX is generally used to obtain elemental information for a planar region, it may be extended to analyze successively milled planes, thus reducing the limit of resolution to the minimum amount of material that can be milled using the FIB. After successive planes are analyzed, the data may be combined, for example, by mapping elemental data to various colors to form a high-resolution three-dimensional image of the sample. This process, although destructive in nature, may be combined with other methods of planar analysis to produce a high-resolution image rich in content to provide, e.g., detailed data regarding the composition of nanostructures.

Figure 17:
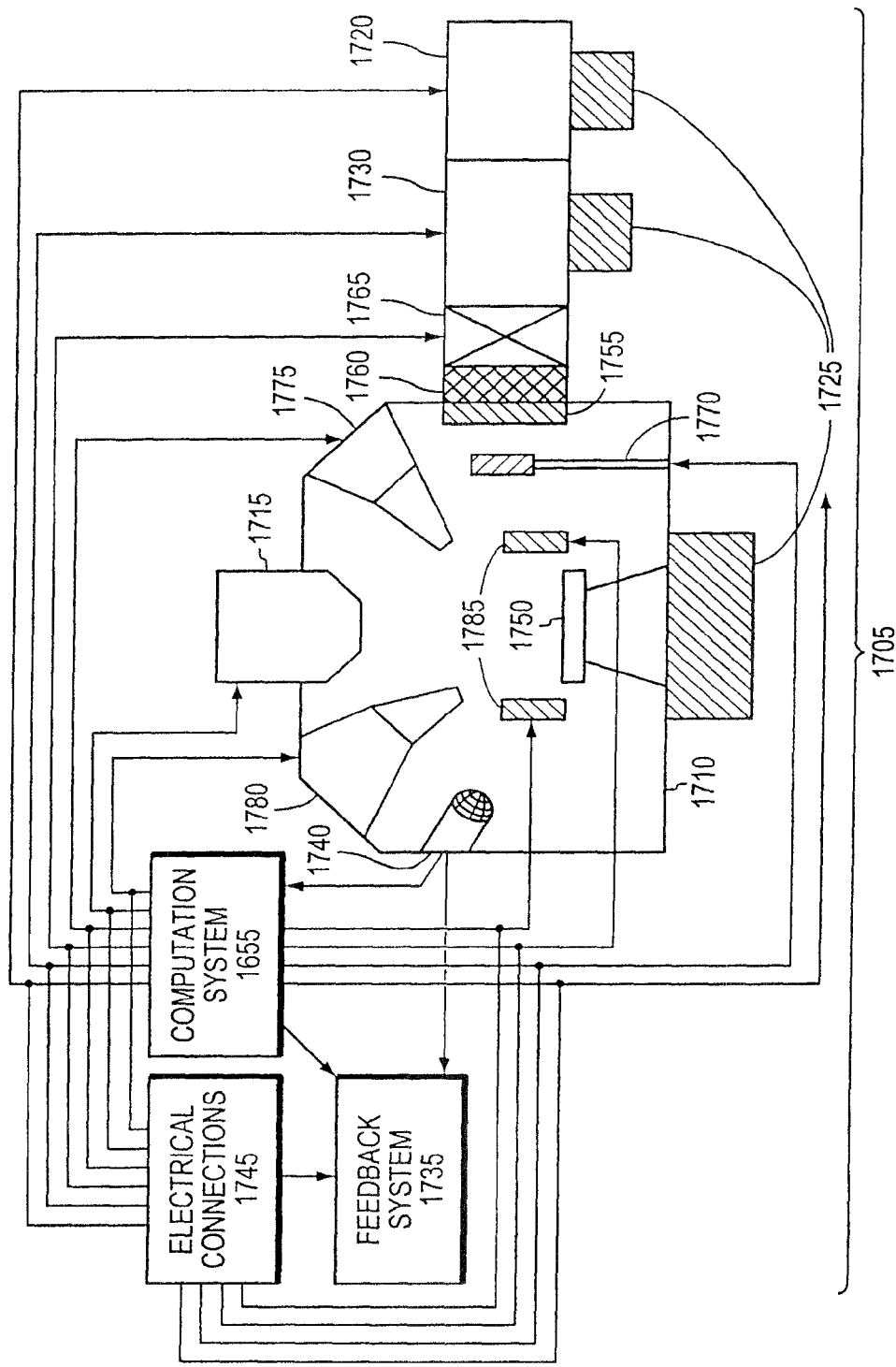
FIG. 17 is a schematic diagram illustrating a system combining a charged ion or electron beam source, a molecular size-scale building block (MSSBB) source for introducing at least one of MSSBBs and nanoscale building blocks, mass and charge selection apparatus, and other vacuum components.

Referring to FIG. 17, a fabrication system 1705 may be used to enable each of the fabrication steps described with reference to FIGS. 1 to 16 to be carried out under a single vacuum. Fabrication system 1705 may combine a number of components, including a deposition chamber 1710, a beam source 1715, an MSSBB source 1720, and vacuum pumps 1725. In some embodiments, an NSBB source may be used instead of MSSBB source 1720. Beam source 1715 may be, e.g., a parallel or singular charged beam source such as an electron- or an ion-beam. Fabrication system 1705 may also include a mass and charge selection apparatus 1730 in fluid communication with the MSSBB source 1720. All of these components may be maintained under a high vacuum, e.g., $10^{-10}$-$10^{-3}$ Torr. Feedback monitoring system 1735 includes computation system 1655, as well as custom feedback software written in a programming language such as, e.g. C, and custom hardware input-output (I/O) boards (not shown), a single or multiple detectors 1740, such as, e.g. an SED or EDX detector, and electrical connections 1745. Electrical connections between computation system 1655 and, for example, the beam source 1715 may be an electrical connection to the X-Y controllers of the scan coils (not shown) that control the scanning of beam source 1715; the connection to the MSSBB source 1720 may be to the power supply that regulates sputtering such as, e.g., a Glassman DC power supply LV-600 (not shown); the connection of feedback monitoring system 1735 to selection apparatus 1730 may be to a power supply (not shown) that initiates mass and charge filtering. Feedback monitoring system 1735 monitors fabrication processes occurring within fabrication system 1705.

Deposition chamber 1710, containing the beam source 1715, is constructed to allow appropriate vacuum connections to be formed between deposition chamber 1710 and the mass and charge selection apparatus 1730. A suitable deposition chamber for use as deposition chamber 1710 may be the XL-30 chamber of a Strata™ DB235 made by FEI Co., or a chamber from MDC Vacuum Corporation such as the Surface Science Analysis Chamber 200000 modified to include beam source 1715. Substrates such as substrate 130 (not shown) may be mounted on stage 1750 within deposition chamber 1710, where the fabrication of features occurs. Stage 1750 may be a five-axis stage that is standard in the XL-30 chamber of a Strata™ DB235 made by FEI Co., or a laser interferometer stage such as a Raith High Precisions Laserstage.

Deposition chamber 1710 may be modified, for example, by the machining of an adapter plate 1755, including an adapter flange 1760, and a valve 1765. Valve 1765 may be a gating valve or a high speed shutter, e.g. pneumatic 8" Gate Valve 303019 from MDC-Vacuum Corporation. In an embodiment without mass and charge selection apparatus 1730, adapter plate 1755 may be machined to MSSBB source 1720. Adapter flange 1760 may be, for example, an 8" conflat flange.

MSSBB source 1720 may be a nanocluster source, e.g. NC200U Nanocluster Source available from Oxford Applied Research. Mass and charge selection apparatus 1730 may be, for example, a mass quadrupole filter, e.g. QMF20 Mass Quadrupole filter available from Oxford Applied Research. Selection apparatus 1730 is attached to MSSBB source 1720 by appropriate vacuum fittings, e.g., a conflat 8" flange.

The feedback monitoring system 1735 may perform data manipulation and algorithms that deduce from input data from one or more detectors 1740, e.g., a SED detector, whether an error has occurred in the fabrication of a nanostructure in deposition chamber 1710. Detector 1740 may also be an EDX detector or CCD for electroluminescence detection. Such components may be placed within the deposition chamber 1710. If an error has occurred during nanostructure fabrication, the feedback software instructs the hardware I/O board to send an appropriate signal to MSSBB source 1720 to start nanocluster production, followed by a signal to selection apparatus 1730 to select clusters of specific charge, mass and velocity, as calculated by the algorithm software. This is followed by a signal to the beam source 1715 to scan a beam in a specified manner to repair the error that has occurred, e.g., the repair may be as described in reference to FIGS. 15 and 16.

Fabrication system 1705 may be maintained at a vacuum by vacuum pumps 1725. Vacuum pumps 1725 may include turbomolecular pumps and roughing pumps. Vacuum pumps 1725 are capable of maintaining a high vacuum, e.g., $10^{-10}$-$10^{-3}$ Torr, in deposition chamber 1710, beam source 1715, selection apparatus 1730, and MSSBB source 1720. Vacuum gauges such as a cold cathode gauge or ion gauge (not shown) may be placed throughout the fabrication system 1705 to monitor pressure.

Additional components may also be incorporated into fabrication system 1705, such as a quartz crystal monitor 1770 to monitor MSSBB deposition rates, a global heat source such as a laser 1775 to sinter patterned particles, additional gas deposition needles 1780 for introduction of gases such as those described with reference to FIGS. 6, 9 to 11, electrostatic components 1785 described with reference to FIGS. 4(*a*)(*c*), a channeltron (not shown) or additional detectors 1740 to be utilized in feedback monitoring system 1735. Each of these components may be added to deposition chamber 1710 through vacuum ports available in, for example, the XL-30 chamber of a Strata™ DB235 made by FEI Co., or through ports of a custom-built chamber. Each of these components is also in electrical communication with computation system 1655.

Fabrication system 1705, including all components of feedback monitoring system 1735 for fabrication of nanostructures, may be operated as follows. First, a substrate such as substrate 130 is introduced into deposition chamber 1710 and mounted onto stage 1750. In one embodiment, the deposition chamber 1710 may be at atmospheric pressure during loading, and substrate 130 may be mounted manually. In another embodiment, deposition chamber 1710 may already be at a vacuum, and substrate 130 may be introduced via a load lock (not shown).

Feedback monitoring system 1735 may be used to automate fabrication system 1705 as well as to monitor feedback during fabrication of nanostructures. After substrate 130 is mounted on stage 1750, feedback monitoring system 1735 may initiate the use of vacuum pumps 1725. Vacuum pumps 1725 may pump down deposition chamber 1710, selection apparatus 1730, and MSSBB source 1720. In some embodiments, MSSBB source 1720 and selection apparatus 1730 may already be maintained at a high vacuum, because the shutter or gate valve 1765 may be kept closed except during deposition. MSSBB source 1720 and selection apparatus 1730 may be vented to atmosphere for maintenance and similar such tasks.

After a suitable vacuum is achieved in deposition chamber 1710, MSSBB source 1720 and selection apparatus 1730, e.g., $10^{-6}$ Torr, the beam source 1715 and other additional components such as detectors 1740, electrostatic components 1785, and quartz crystal monitor 1770, may be similarly initiated by the feedback monitoring system 1735. At this point, custom automation software may be launched to initiate the fabrication of a nanostructure in deposition chamber 1710. This nanostructure may be designed by custom software similar to AutoDesk Inventor or DesignCad, where the structure and composition of the nanostructure are indicated.

After the automation software is launched, fabrication may proceed as described, for example, with reference to FIG. 1(*a*)_(*c*). More specifically, the feedback system 1735 may direct the beam source 1715 to write charge pattern 120 (not shown) into substrate 130. Next, the feedback monitoring system 1735 may check to determine if the charge pattern 120 was written properly. Error detection and correction of the charge pattern may be carried out as described with reference to FIGS. 15 and 16.

After the desired charge pattern 120 is written, the feedback monitoring system 1735 may direct the MSSBB source 1720 to introduce, for example, a stream of MSSBBs or nanoscale building blocks such as nanoclusters 140 (not shown). Then, feedback monitoring system 1735 may initiate the selection apparatus 1730, which may begin to filter nanoclusters 140 for a pre-determined mass and charge. Gate valve or high-speed shutter 1775 may also be opened by feedback system 1735 at this time. Nanoclusters 140 may then be introduced into deposition chamber 1710 and may, for example, reach a low velocity due to interaction with electrostatic components 1785. At this point, the nanoclusters may be attracted by and adhere to the charge pattern 120. The feedback system 1735 could then verify that the nanoclusters 140 were placed properly, and could make modifications as described with reference to FIGS. 15 and 16 to correct errors. After nanoclusters 140 are properly placed on charge pattern 120, feedback monitoring system 1735 may initiate the global sintering of particles using laser 1780. This process may be repeated layer by layer until the desired nanostructure is constructed.

The invention may be embodied in other specific forms without departing from the spirit or essential characteristics thereof The foregoing embodiments are therefore to be considered in all respects illustrative rather than limiting on the invention described herein. The scope of the invention is thus indicated by the appending claims rather than by the foregoing description, and all changes which come within the meaning and range of equivalency of the claims are intended to be embraced therein.

What is claimed is:

1. A method for forming a structure, the method comprising:
    defining a first region of a substrate having a charge of a first type;
    defining a second region of the substrate having a charge of a second type; and
    dusting the first and second regions of the substrate with a plurality of at least one of molecular-size scale and nanoscale building blocks having a charge of the second type, wherein the building blocks are repelled from the second region of the substrate and directly image the first region of the substrate to form the structure, such that the building blocks adhere only to the first region of the substrate.

2. The method of claim 1, further comprising:
    creating a net charge pattern on the substrate, the charge pattern having the second type of charge;
    introducing a second plurality of at least one of molecular-size scale and nanoscale building blocks to a region proximate to the net charge pattern, the building blocks having a charge of the first type, wherein the building blocks directly image the charge pattern to form the structure, such that the building blocks adhere only to the charge pattern.

3. The method of claim 2, wherein the building blocks comprise nanoclusters.

4. The method of claim 3, further comprising the step of globally sintering the adhered nanoclusters together, forming the structure as a locally solid pattern.

5. The method of claim 4, wherein the sintered-together nanoclusters form a monolayer.

6. The method of claim 2, wherein the charge pattern is formed with an energy beam.

7. The method of claim 2, wherein the charge pattern is formed with a plurality of energy beams.

8. The method of claim 2, wherein the building blocks are introduced to the charge pattern by dusting.

9. The method of claim 2, wherein the building blocks are introduced to the charge pattern by directing them toward the substrate as a stream.

10. The method of claim 9, further comprising:
controlling a velocity of the plurality of building blocks.

11. The method of claim 10, wherein the velocity of at least a portion of the plurality of building blocks is reduced in the region proximate the charge pattern.

12. The method of claim 10, wherein the velocity of at least a portion of the plurality of building blocks is controlled by an electric or magnetic field.

13. The method of claim 10, wherein the velocity of at least a portion of the plurality of building blocks is controlled by a charged aperture disposed near the substrate.

14. The method of claim 1, wherein the building blocks are selected from the group consisting of ions, nanoclusters, nanoparticles, and organic molecules.

* * * * *